United States Patent
Beaumont et al.

(10) Patent No.: US 6,325,850 B1
(45) Date of Patent: Dec. 4, 2001

(54) METHOD FOR PRODUCING A GALLIUM NITRIDE EPITAXIAL LAYER

(75) Inventors: Bernard Beaumont, Valbonne; Pierre Gibart, Chateauneuf de Grasse; Jean-Claude Guillaume, La Gaude; Gilles Nataf, Cagnes sur Mer; Michel Vaille, Antibes; Soufien Haffouz, Nice, all of (FR)

(73) Assignee: Centre National de la Recherché Scientifique (CNRS), Paris (FR)

( * ) Notice: Subject to any disclaimer, the term of this patent is extended or adjusted under 35 U.S.C. 154(b) by 0 days.

(21) Appl. No.: 09/530,050

(22) PCT Filed: Oct. 15, 1998

(86) PCT No.: PCT/FR98/02212

§ 371 Date: Jul. 7, 2000

§ 102(e) Date: Jul. 7, 2000

(87) PCT Pub. No.: WO99/20816

PCT Pub. Date: Apr. 29, 1999

(30) Foreign Application Priority Data

Oct. 20, 1997 (FR) .................................................. 97 13096

(51) Int. Cl.$^7$ .................................................. C30B 25/14
(52) U.S. Cl. .................................. 117/95; 117/96; 117/97; 117/952; 257/103
(58) Field of Search .............................. 257/103; 117/95, 117/96, 97, 952

(56) References Cited

U.S. PATENT DOCUMENTS

| | | | |
|---|---|---|---|
| 4,971,928 | * 11/1990 | Fuller . | |
| 5,874,747 | * 2/1999 | Redwing et al. | 257/77 |
| 5,962,875 | * 10/1999 | Motoki et al. | 257/103 |
| 6,093,965 | * 7/2000 | Nakamura et al. | 257/749 |
| 6,100,104 | * 8/2000 | Haerle | 438/33 |

OTHER PUBLICATIONS

Kapolnek et al. "Anisotropic Epitaxial Lateral Growth in GaN Selective Area Epitaxy" Applied Physics Letters vol. 71, No. 9, pp. 1204–1206, Sep. 1997.*

Kapolnek et al. "Selective Area Epitaxy of GaN for electron field emission devices" Journal of Crystal Growth vol. 170 No. 1–4 340–343, Jan. 1997.*

* cited by examiner

*Primary Examiner*—Robert Kunemund
(74) *Attorney, Agent, or Firm*—Blakely Sokoloff Taylor & Zafman

(57) ABSTRACT

The invention concerns a method for producing a gallium nitride (GaN) epitaxial layer characterised in that it consists in depositing on a substrate a dielectric layer acting as a mask and depositing on the masked gallium nitride, by epitaxial deposit, so as to induce the deposit of gallium nitride patterns and the anisotropic lateral growth of said patterns, the lateral growth being pursued until the different patterns coalesce. The deposit of the gallium nitride patterns can be carried out ex-situ by dielectric etching or in-situ by treating the substrate for coating it with a dielectric film whereof the thickness is of the order of one angstrom. The invention also concerns the gallium nitride layers obtained by said method.

30 Claims, 6 Drawing Sheets

FIG_3

FIG._4

METHOD FOR PRODUCING A GALLIUM NITRIDE EPITAXIAL LAYER

The present invention relates to a process for producing an epitaxial layer of gallium nitride (GaN) as well as to the epitaxial layers of gallium nitride (GaN) which can be obtained by said process. Such a process makes it possible to obtain gallium nitride layers of excellent quality.

It also relates to the short-wavelength optical devices or the high-power high-frequency electronic devices provided with such an epitaxial gallium nitride layer.

It relates in particular to optoelectronic components formed on such gallium nitride layers.

Processes are known for obtaining relatively thick GaN layers, for example from 100 to 200 micrometers. The method commonly used is chloride and hydride vapor phase epitaxy (HVPE). Either sapphire substrates or GaN layers on sapphire 200 micrometers in thickness are used, these layers being fabricated by OrGaNoMetallic Pyrolisis Vapor Phase Epitaxy (OMVPE). However the crystal lattice parameter mismatch between sapphire and GaN is such that the build-up of stresses in the layers results in cracks and prevents the sapphire substrate from being removed. All the experimental innovations (treatment of the surface of the sapphire at the start of growth with GaCl, deposition of a ZnO interlayer) have not made it possible to solve this problem. At the present time, the relatively thick GaN layers have a double X-ray diffraction (DXD) line width of the order of at best 300 arcsec, which means that the crystallographic quality does not exceed that of the layers formed by OMVPE or by molecular beam epitaxy (MBE).

In other words, no potential sapphire, ZnO, 6H—SiC or LiAlO$_2$ substrate is ideal for nitride epitaxy (excessively high lattice mismatch and thermal expansion coefficient mismatch, thermal instability).

Moreover, the lasing effect (by optical pumping) on GaN has been known for a long time. Although diode lasers based on III–V nitride have been produced, the crystal quality of the nitride layers constituting the structure of these lasers is very average. Dislocation densities ranging from $10^9$ to $10^{10}$ cm$^{-2}$ have been measured.

In fact, the defects associated with the formation of relatively thick epitaxially grown GaN layers indicated above have considerably slowed down the development of diode lasers provided with such layers: high residual n, absence of single crystals and of suitable substrates, impossibility of producing p-doping.

The publication by D. Kalponek et al., Journal of Crystal Growth, 170 (1997) 340–343 mentions the localized nitride growth in apertures formed in a mask so as to form pyramidal structures. However, this document neither describes nor suggests the formation, by coalescence, of features or islands of smooth gallium nitride layers.

The publication Y. Kato, S. Kitamura, K. Hiramatsu and N. Sawaki, J. Cryst. Growth, 144, 133 (1994) describes the selective growth of gallium nitride by OMVPE on sapphire substrates on which has been deposited a thin gallium nitride layer masked by an SiO$_2$ layer etched so as to reveal continuous bands of gallium nitride.

However, the localized epitaxy thus carried out involves neither the lateral growth nor the growth anisotropy as will be described below.

The document EP 0,506,146 describes a process for local and lateral growth using a mask, shaped by lithography, to localize the growth. The examples of smooth layers relate in no case to gallium nitride. These examples mention GaAs homoepitaxy on a GaAs substrate and InP homoepitaxy on an InP substrate.

The object of the process according to the invention is to obtain crystalline layers allowing the production of optoelectronic devices (especially diode lasers) having life times and performance characteristics which are superior to those obtained previously.

SUMMARY OF INVENTION

The inventors have found that the treatment of a substrate by deposition of a suitable dielectric followed by deposition of gallium nitride, which is itself followed by thermal annealing, causes the formation of gallium nitride islands which are virtually defect-free.

The coalescence of such islands caused by the heat treatment results in a gallium nitride layer of excellent quality.

The invention relates firstly to a process for producing a layer of gallium nitride (GaN), characterized in that it comprises the deposition on a substrate of a dielectric layer functioning as a mask and the regrowth of gallium nitride on the masked substrate under epitaxial deposition conditions so as to induce the deposition of gallium nitride features and the anisotropic and lateral growth of said features, the lateral growth being continued until coalescence of the various features. The term "islands" instead of "features" may also be employed.

The substrate generally has a thickness of a few hundred micrometers (in particular, approximately 200 micrometers) and may be chosen from the group consisting of sapphire, ZnO, 6H—SiC, LiAlO$_2$, LiGaO$_2$ and MgAl$_2$O$_4$. The substrate is preferably treated beforehand by nitriding.

Preferably, the dielectric is of the Si$_x$N$_y$ type, especially Si$_3$N$_4$. SiO$_2$ may also be mentioned, but other well-known dielectrics could be used. The deposition of the dielectric is carried out in the gallium nitride growth chamber from silane and ammonia.

Preferably, the carrier gas is an N$_2$/H$_2$ mixture.

According to a first embodiment, the dielectric layer is an atomic monolayer, or a cover of the order of the atomic plane.

Next, epitaxial regrowth on the substrate is carried out using OMVPE. Regular features or islands develop. Examination in a high-resolution electron microscope shows that the GaN dislocation density in the regular features or islands, which has therefore grown without heteroepitaxial strains, is very much less than that produced by the direct deposition of gallium nitride on the substrate. Thus, the GaN growth, which takes place laterally in the [10$\bar{1}$0] directions on a dielectric surface, and therefore without being in epitaxial relationship with the sapphire substrate, results in much better GaN crystal quality than the usual processes. After said features have been obtained, the growth may be continued, either using OMVPE or HVPE. Growth takes place laterally, until coalescence of the islands. These surfaces resulting from the coalescence of islands exhibit crystal quality superior to the layers grown heteroepitaxially on sapphire.

The gallium nitride deposition is generally carried out in two steps. A first step, at a temperature of approximately 600° C. for the deposition of a buffer layer, from which the GaN features will emerge, then at a higher temperature (approximately 1000–1100° C.) for the growth of an epilayer from said features.

According to a second embodiment, the invention relates to a process characterized in that the dielectric layer is etched, so as to define apertures and to expose the facing regions of the substrate, and gallium nitride is regrown under epitaxial deposition conditions on the masked and etched substrate so as to induce the deposition of gallium nitride features on the facing regions and the anisotropic and lateral growth of said features, the lateral growth being continued until coalescence of the various features.

According to a third embodiment, the invention relates to a process for producing an epitaxial layer of gallium nitride (GaN), comprising the deposition of a thin gallium nitride layer on a substrate characterized in that:

a dielectric layer is deposited on said thin gallium nitride layer;

the dielectric layer is etched so as to define apertures and to expose those regions of said thin gallium nitride layer which face them;

gallium nitride is regrown under epitaxial deposition conditions on the expitaxially grown, masked and etched substrate so as to induce the deposition of gallium nitride features on the facing regions and the anisotropic and lateral growth of said features, the lateral growth being continued until coalescence of the various features.

The process according to the invention is noteworthy in that it limits the density of defects generated by the parameter mismatch between GaN and the substrate using a method which combines localized epitaxy, growth anisotropy and lateral growth, thereby limiting the epitaxial strains.

The process according to the invention makes use of deposition and etching techniques well-known to those skilled in the art.

According to the second embodiment, a dielectric a few nanometers in thickness is deposited in the growth chamber. Next, by photolithography, apertures are defined in the dielectric layer, thus exposing micrometric regions of the surface of the substrate.

Regrowth on the masked and etched substrate is carried out using OMVPE.

The substrate generally has a thickness of a few hundred micrometers (in particular, approximately 200 micrometers) and may be chosen from the group consisting of sapphire, ZnO, 6H—SiC, LiAlO$_2$, LiGaO$_2$ and MgAl$_2$O$_4$.

Preferably, the dielectric is of the Si$_x$N$_y$ type, especially Si$_3$N$_4$. SiO$_2$ may also be mentioned, but other well-known dielectrics could be used. The dielectric is deposited in the gallium nitride growth chamber from silane and ammonia directly on the substrate, as described above.

According to the third embodiment, the gallium nitride is firstly grown epitaxially on the substrate by OMVPE. The deposition of a dielectric a few nanometers in thickness is then carried out in the growth chamber. Next, by photolithography, apertures are defined in the dielectric layer, thus exposing micrometric regions of the gallium nitride surface.

Regrowth on the epitaxially grown, masked and etched substrate is carried out using OMVPE.

The substrate generally has a thickness of a few hundred micrometers (in particular, approximately 200 micrometers) and may be chosen from the group consisting of sapphire, ZnO, 6H—SiC, LiAlO$_2$, LiGaO$_2$ and MgAl$_2$O$_4$.

Preferably, the dielectric is of the Si$_x$N$_y$ type, especially Si$_3$N$_4$. SiO$_2$ may also be mentioned, but other well-known dielectrics could be used. The dielectric is deposited in the gallium nitride growth chamber from silane and ammonia directly after the gallium nitride deposition.

The etching of the dielectric is in particular carried out by photolithography.

Discrete apertures, or apertures in the form of stripes, are defined in the silicon nitride layer, thus exposing the gallium nitride surface on a micrometric feature. The apertures are preferably regular polygons, especially ones of hexagonal shape. Advantageously, the discrete apertures are inscribed in a circle of radius of less than 10 micrometers, whereas the apertures in the form of stripes have a width of less than 10 micrometers, the length of the stripes being limited only by the size of the substrate.

Spacing of the apertures is regular and must allow localized gallium nitride epitaxy followed by anisotropic and lateral growth.

In general, the portion of exposed area of substrate or of gallium nitride to the total area of the substrate is between 5 and 80%, preferably between 5 and 50%.

It has been found that gallium atoms are not deposited on the dielectric and that, in other words, this etched dielectric surface allowed the gallium atoms to concentrate on the apertures.

Next, regrowth on the substrate is carried out using OMVPE. Regular features or islands develop. Examination in a high-resolution electron microscope shows that the GaN dislocation density in the regular features or islands, which has therefore grown without heteroepitaxial strains, is very much less, in the case of the third variant, than that existing in the first GaN layer. Thus, the GaN growth, which takes place laterally in the [10$\bar{1}$0] directions on a dielectric surface, and therefore without being in epitaxial relationship with the sapphire substrate, results in much better GaN crystal quality than the usual processes. After obtaining an array of regular features, the growth may be continued, either by OMVPE or by HVPE. It is carried out laterally, until coalescence of the islands. These surfaces resulting from the coalescence of islands exhibit superior crystal quality to the layers grown heteroepitaxially on sapphire.

The novelty of the process therefore consists in using the growth anisotropy to induce lateral growth, going as far as coalescence, and thus in obtaining a continuous strain-free GaN layer. The lateral growth takes place from gallium nitride features or islands having reduced defect densities, said features being obtained by localized epitaxy.

According to a variant, the epitaxial regrowth is carried out using undoped gallium nitride.

According to another variant, the epitaxial regrowth is carried out using gallium nitride doped with a dopant chosen from the group consisting of magnesium, zinc, cadmium, beryllium, calcium and carbon, especially with magnesium. This is because it has been found that the doping of gallium nitride with a doping agent, especially magnesium, modified the GaN growth mode and resulted in a relative increase in the growth rate in the <10$\bar{1}$1> directions with respect to the growth rate in the [0001] direction. Preferably, the dopant/Ga molar ratio is greater than 0 and less than or equal to 1, advantageously less than 0.2.

According to another advantageous variant, the epitaxial regrowth is carried out in two steps.

Firstly, undoped gallium nitride is deposited on the etched dielectric or with a thickness of the order of one angstrom, under vertical growth anisotropy conditions, and then gallium nitride continues to be deposited in the presence of a dopant in order to favor the lateral growth resulting in coalescence of the features.

The invention also relates to the epitaxially grown gallium nitride layers, characterized in that they can be obtained by the above process. Advantageously, these layers have a defect density of less than those obtained in the prior art, especially less than approximately $10^9$ cm$^{-2}$.

Preferably, the epitaxial layer has a thickness of between 1 and 1000 micrometers and optionally in that it is self-supported after the substrate has been separated.

The invention finds particularly advantageous application in the production of diode lasers provided with an epitaxial gallium nitride layer described above.

BRIEF DESCRIPTION OF DRAWING

Several embodiments of the process according to the invention will now be described in relation with FIGS. 1 and 8 and the examples.

FIG. 6 shows the advantageous effect of the magnesium dopant on the GaN growth mode in that it allows coalescence of the features to be obtained much more rapidly, resulting in the formation of a strain-free continuous gallium nitride layer in epitaxial relationship.

DETAILED DESCRIPTION OF INVENTION

EXAMPLE 1

Figure 1:
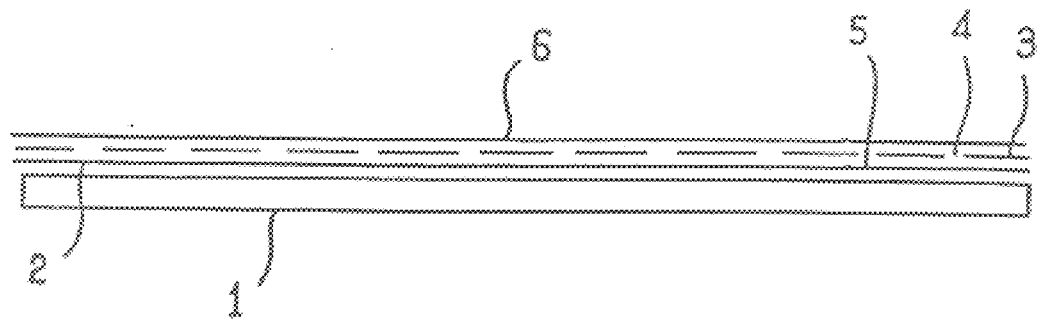
FIG. 1 is a schematic cross-sectional view of a gallium nitride layer according to the invention.

Deposition of an Undoped Gallium Nitride Layer

A suitable vertical reactor operating at atmospheric pressure is used for the OrGaNometallic Vapor Phase Epitaxy. A thin gallium nitride layer 2 having a thickness of 2 μm is deposited, by orGaNometallic vapor phase epitaxy at 1080° C. on a (0001) sapphire substrate 1 having a thickness of 200 μm. The gallium source is trimethylgallium (TMGa) and the nitrogen source is ammonia. Such a method is described in many documents.

The experimental conditions are as follows:

The gaseous vehicle is a mixture of $H_2$ and $N_2$ in equal proportions (4 sl/min.). The ammonia is introduced via a separate line (2 sl/min.).

After the first gallium nitride epilayer has been grown, a thin layer of a silicon nitride film 3 is deposited as a mask for the subsequent selective growth of gallium nitride using $SiH_4$ and $NH_3$ at a rate of 50 sccm and 2 slm, respectively.

The electron transmission microscope observations on cross sections show that the mask obtained forms an amorphous continuous layer having a thickness of approximately 2 nm. Since the stoichiometry of this film was not measured, the term SiN will be used for the rest of this specification. Nevertheless, it seems that the stoichiometry corresponds to the $Si_3N_4$ term. Although extremely thin, this SiN layer proved to be a perfectly selective mask. The etching is then carried out, by photolithography and reactive ion etching, in order to expose hexagonal apertures 4 circumscribed by a 10 μm diameter circle. The distance between the centers of two adjacent apertures in the mask is 15 μm. The epitaxial regrowth on the exposed gallium nitride regions 5 in order to deposit gallium nitride is carried out on the specimens etched under conditions similar to those used for the standard gallium nitride growth, apart from the TMGa flow rate. This is fixed at a lower value (typically 16 μmol/min. for the experiments with undoped gallium nitride) so as to avoid high growth rates resulting from the very effective collection near the regions 5 of the gallium atoms encountering the surface of the mask. The localized epitaxy reveals a growth rate Vc of gallium nitride 6 in the [0001] direction virtually proportional to the space in between two apertures.

In addition, no nucleation on SiN is observed, even for large spacings. From this it may be concluded that the nucleation and the growth of GaN occurs selectively in the apertures 5. Consequently, the masked areas behave as concentrators, directing the atoms toward the apertures.

The growth rates are measured either in situ by laser reflectometry, or thereafter by scanning electron microscopy (SEM) on drop views or sections.

Figure 2:
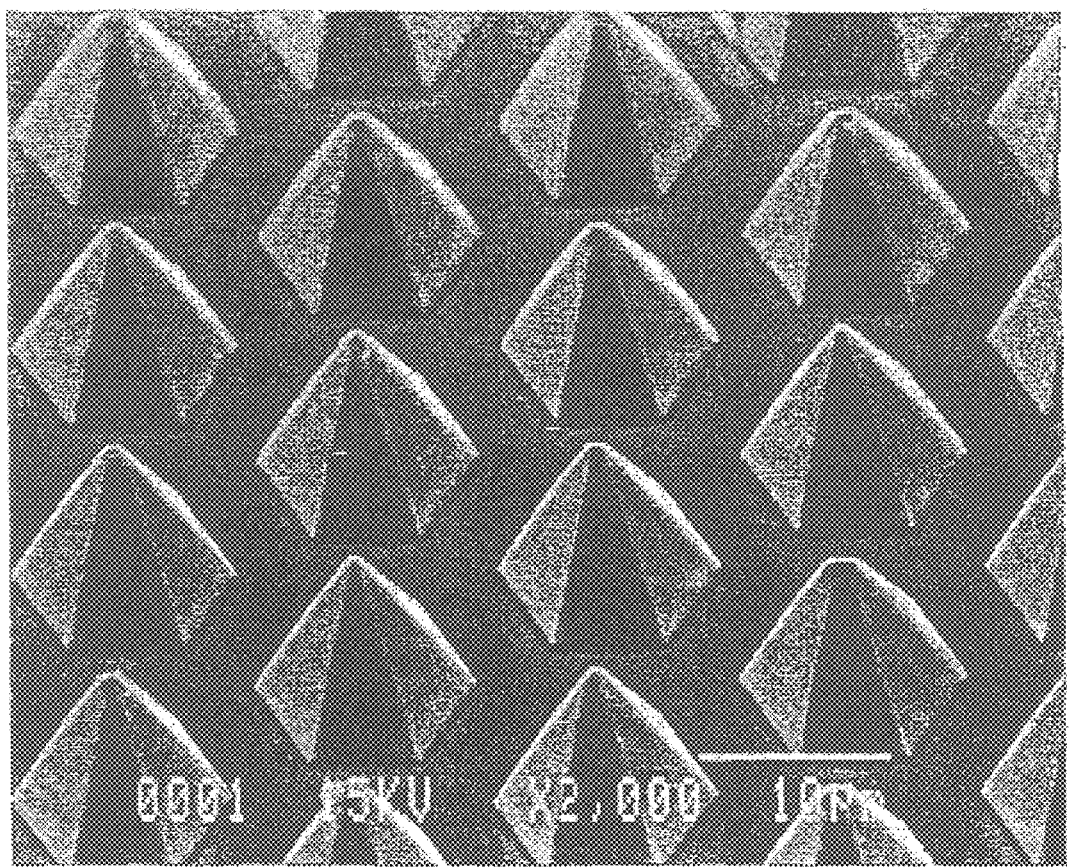
FIG. 2 is a photograph showing regular pyramidal features formed during the localized epitaxy using undoped gallium nitride, when the apertures in the dielectric are discrete apertures.

FIG. 2 is an SEM photograph showing the development of the pyramids.

Figure 3:
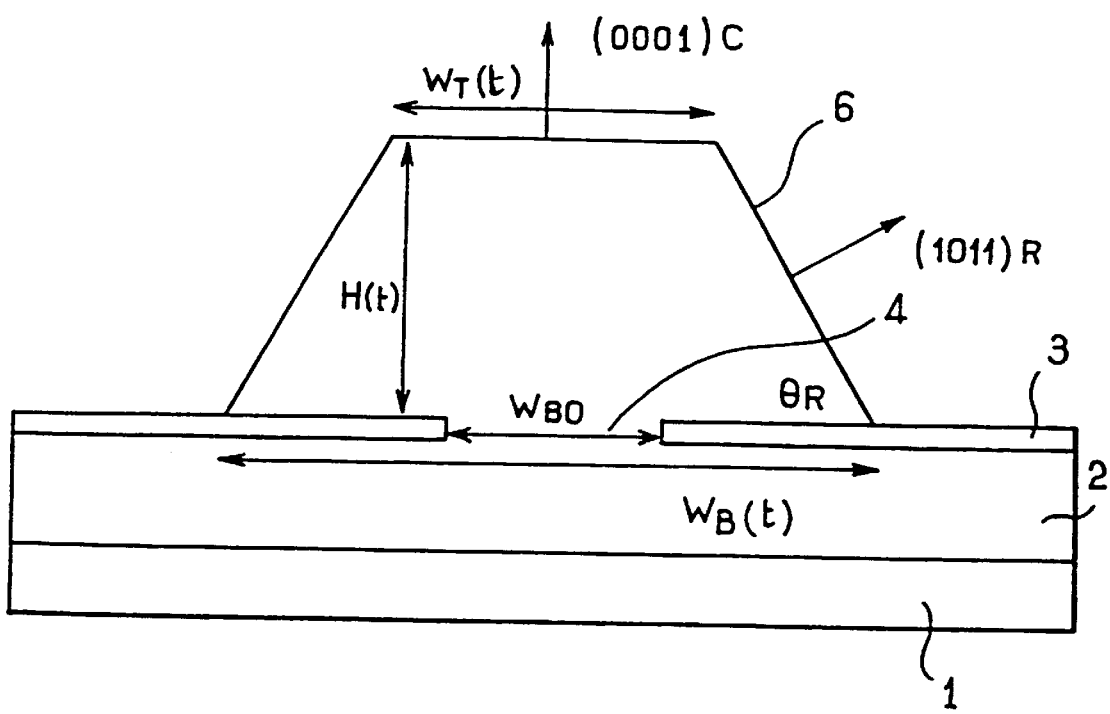
FIG. 3 is a sectional view perpendicular to the [11$\bar{2}$0] direction of a localized gallium nitride truncated hexagonal pyramid.

FIG. 3 is a sectional view perpendicular to the [11$\bar{2}$0] direction of a localized, truncated hexagonal gallium nitride pyramid. $W_T$, $W_B$ and H depend on the time t. $\theta_R$ is the angle between (0001) and (1011) defining the planes. $W_{B0}$ is the width of the apertures in the SiN mask.

Figure 4:
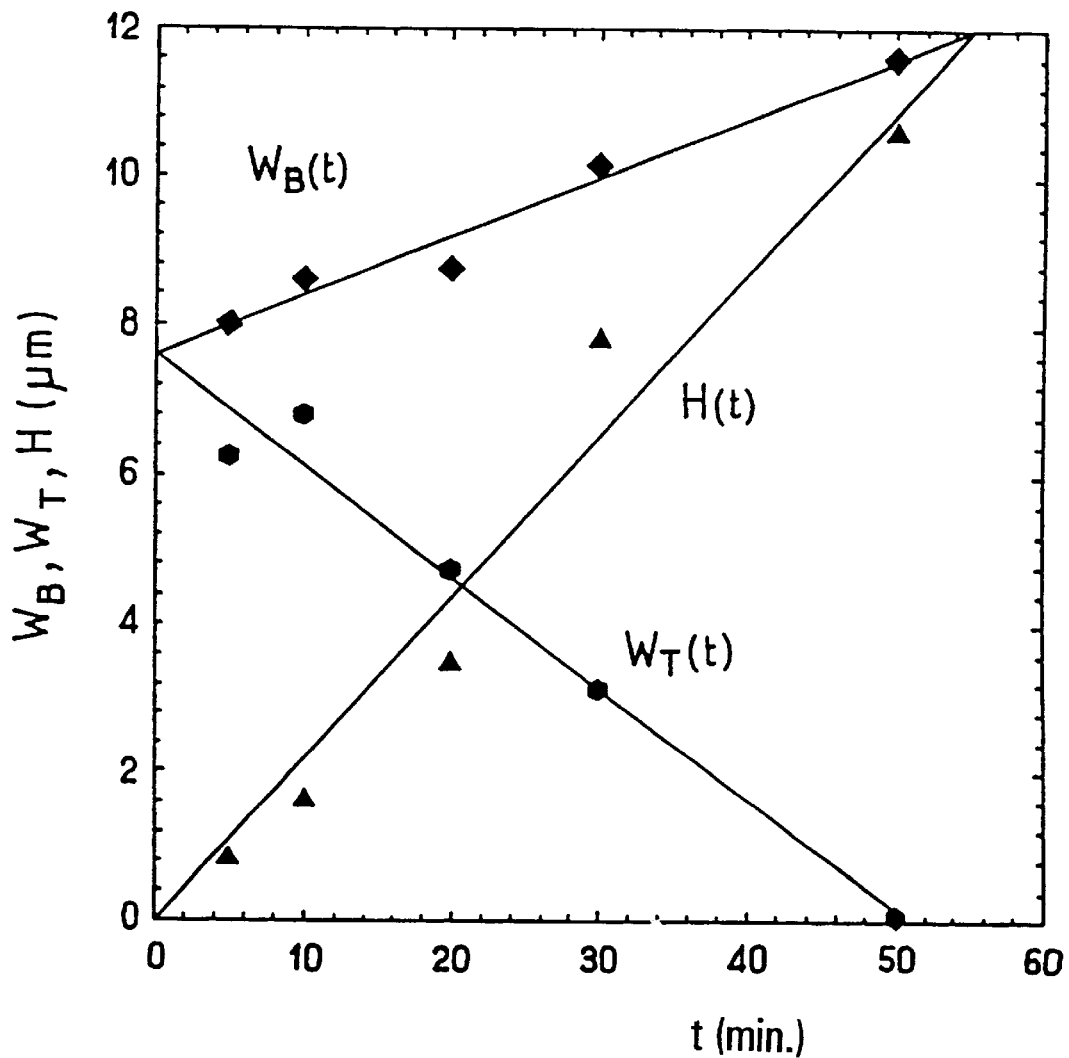
FIG. 4 shows the variation in $W_T$, $W_B$ and H values in μm as a function of the growth time in min. $W_T$, $W_B$ and H are defined in FIG. 3.

FIG. 4 shows the variation in the $W_T$, $W_B$ and H values in μm as a function of the growth time in min. Using linear regressions through the experimental points, the following results are obtained:

$V_R$=2.1 μm/h (lateral rate in the [10$\bar{1}$1] direction);

$V_C$=13 μm/h (rate in the [0001] direction);

$W_{B0}$=7.6 μm;

$\theta_R$=62.1°.

When $W_T$=0 at $t_0$ (the pyramid has a peak of zero width), the height H varies at a lower rate, given by the formula $V_R/\cos(\theta_R)$ It will be noted that $V_C$ is extremely high compared with the rate of 1 μm/h measured for standard epitaxy on a (0001) substrate using the same vapor phase composition. Consequently, the $V_R/V_C$ ratio is only approximately 0.15.

EXAMPLE 2

Deposition in the Gaseous Phase of a Layer of Gallium Nitride To Which Magnesium Has Been Added The experiment of Example 1 is repeated apart from the fact that 2.8 μmol/min. of (MeCp)$_2$Mg is introduced in the vapor phase. The conditions used are: growth time 30 min., growth temperature 1080° C., TMGa 16 μmol/min. and $N_2$, $H_2$ and $NH_3$ 2 sl/min. for each of them.

Figure 6:
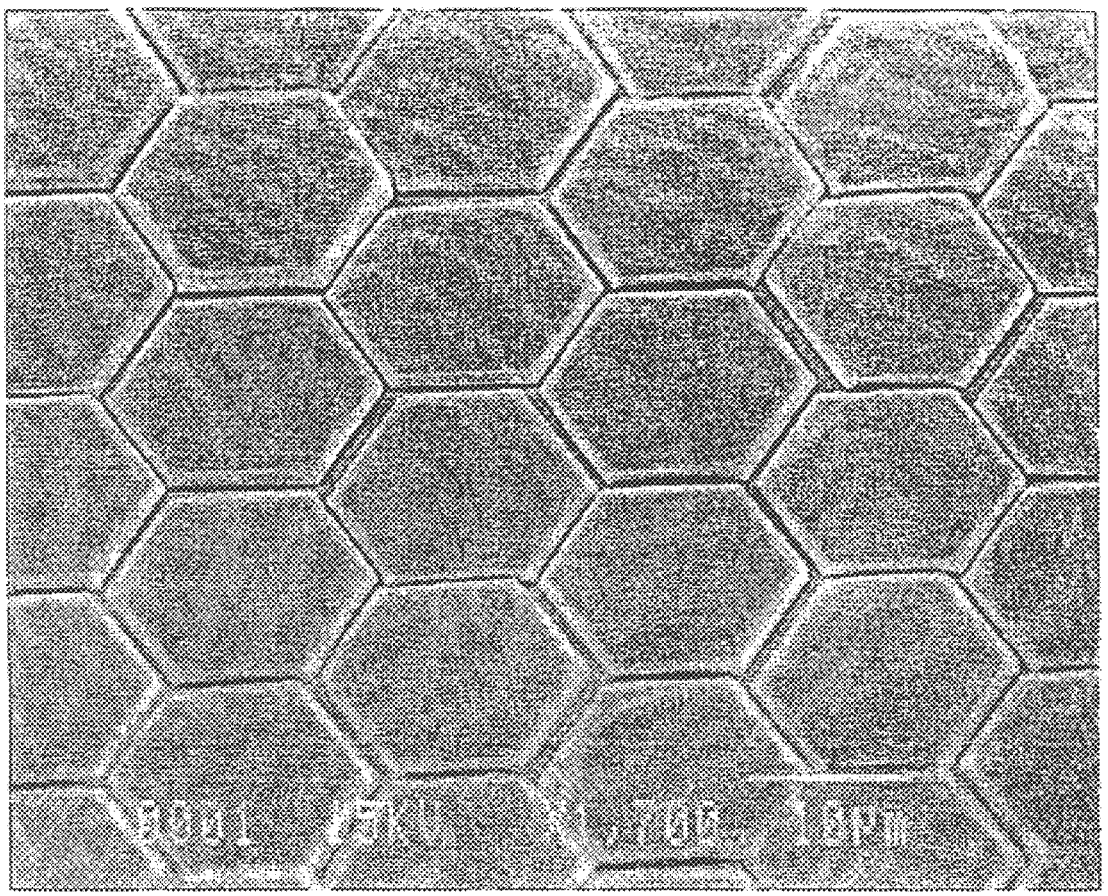
FIG. 6 is a photograph of the observed pyramids obtained by localized epitaxial regrowth with magnesium-doped GaN.

FIG. 6 shows that the presence of magnesium increases the $V_R/V_C$ ratio well above the cos ($\theta_R$) threshold and consequently the (0001) upper facet broadens. The selectivity of the growth is not affected by the presence of (MeCp)$_2$Mg, but the growth anisotropy is advantageously modified.

EXAMPLE 3
Influence of the Mg/Ga Molar Ratio

Figure 5:
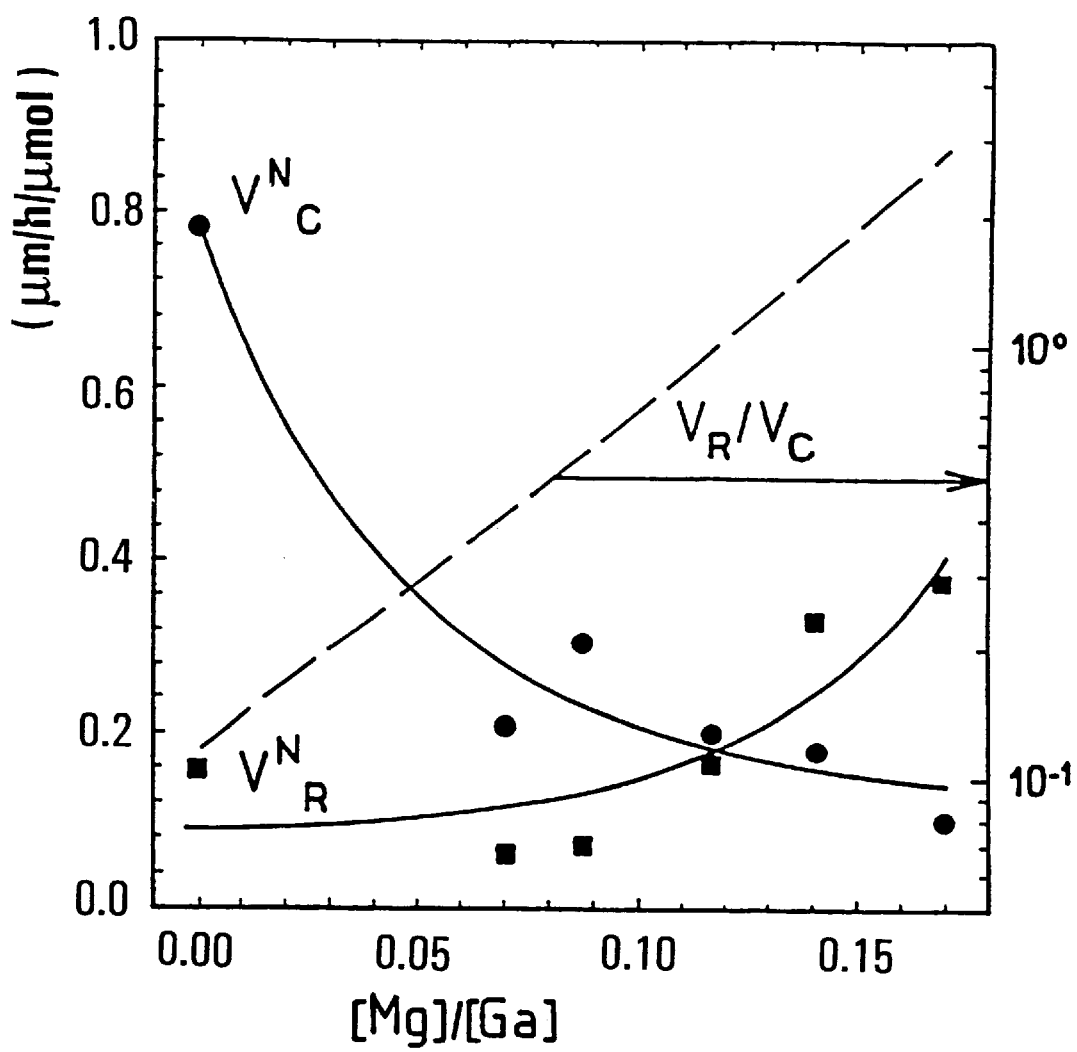
FIG. 5 shows the variation in the growth rates normalized to the molar flux of TMGA in the [0001] and <10$\bar{1}$1> directions as a function of the Mg/Ga molar ratio in the vapor phase.

FIG. 5 shows the variation in the growth rates normalized to the TMGA molar flux in the [0001] and [10$\bar{1}$1] directions as a function of the Mg/Ga molar ratio in the vapor phase.

In practice, it was chosen to keep a constant flux of (MeCp)$_2$ Mg and to vary the amount of TMGA. This makes it possible to ensure that the available Mg concentration on the surface of the growth islands is identical for all the specimens.

Because the growth is controlled linearly by the amount of gallium supplied, the growth rates are normalized in order to compare them.

$V^N_C$ rapidly decreases from 0.8 to 0.1 $\mu$m/h/$\mu$mol, while $V^N_R$ increases from 0.16 to 0.4 $\mu$m/h/$\mu$mol when the Mg/Ga molar ratio varies from 0 to 0.17. The dotted line is the curve of the $V_R/V_C$ ratio obtained by extrapolation. The y-axis on the right is $V_R/V_C$.

This curve shows that the incorporation of Mg allows the pyramidal structure to be easily controlled by modifying the growth anisotropy. This suggests that Mg acts as a surfactant, favoring the adsorption of gallium on the {10$\bar{1}$1} faces but, conversely, preventing it on the (0001) faces.

EXAMPLE 4
Two-step Deposition of a Gallium Nitride Layer

Firstly, the process according to the invention is carried out using epitaxial regrowth under operating conditions comparable to those of Example 1.

An SiN mask is deposited on a GaN layer deposited beforehand in an epitaxial manner in a suitable reactor on a crystallization substrate such as sapphire. Linear apertures 5 $\mu$m in width and spaced apart by 5 $\mu$m are then made in the mask in order to expose the regions of the subjacent layer. The linear apertures are advantageously oriented in the GaN [10$\bar{1}$0] direction, although the variant of the process described in this example can be optionally carried out for other orientations of the linear apertures, especially in the GaN [11$\bar{2}$0] direction.

The epitaxial regrowth is carried out on the exposed regions with unintentionally doped GaN under operating conditions such that the growth rate in the [0001] direction of the GaN features sufficiently exceeds the growth rate in the direction normal to the inclined flanks of said features. Under such conditions, the anisotropy of the growth results in the disappearance of the (0001) facet. The first implementation step of the process is completed when the (0001) facet of the GaN feature has disappeared. At the end of the first step, the GaN features are in the form of a stripe, the cross section of which is triangular. However, it is possible to continue the first step until coalescence of the GaN features, in order to completely recover the mask. In this case, the cross section of the coalesced GaN features is a zigzag line.

The second step consists of the epitaxial regrowth with doped GaN, especially with magnesium-doped GaN according to Example 2 or 3, on the GaN features created in the first step. Due to the effect of introducing the dopant, the growth anisotropy is conducive to planarization of the GaN features. The facet C reappears at the top of each of the GaN features obtained in the first step. During this second step, the doped GaN features develop with an expansion of the facet C and, on the contrary, a reduction in the area of the flanks. The second step of the process according to the example is completed when the flanks have disappeared, the upper surface of the deposit formed by the coalesced doped-GaN features then being plane.

The implementation of the two-step process according to the invention as described above results, on the one hand, in the formation of a plane GaN layer, which can therefore serve as GaN substrate for the subsequent deposition, by epitaxial regrowth, of a device structure, especially a diode laser structure, but results, on the other hand, in a highly advantageous improvement in the crystal quality of said substrate. This is because the lines of crystal defects in the subjacent GaN layer propagate via the aperture made in the mask, vertically into the undoped GaN feature created in the first step. However, it seems that these lines of defects become curved during the second step devoted to the deposition of a doped-GaN features. This results in lines of defects which propagate in directions parallel to the surface of the masked GaN layer.

Because of the modification of the direction of propagation of the defects, the upper surface formed by the coalescence of the GaN features is virtually free of emerging defects in regions compatible with the size of electronic devices, such as GaN diode lasers.

EXAMPLE 5
Deposition of a Gallium Nitrite Layer Directly on a Substrate Masked by a Dielectric This example illustrates a method making it possible to obtain spontaneous formation of gallium nitride features or islands on a substrate by a treatment consisting in covering the substrate with a dielectric, especially silicon nitride, film whose thickness is of the order of 1 Ångström. Advantageously, this method makes it possible to avoid having to use ex situ etching of the mask by expensive techniques such as photolithography and chemical etching.

A suitable epitaxial growth reactor is used for the orGanometallic vapor phase epitaxy. Explicitly, a substrate, especially (0001) sapphire chemically prepared beforehand by degreasing and pickling in an $H_2SO_4$:$H_3PO_4$ acid solution, in a 3:1 ratio, is heated to a temperature of approximately 1050–1080° C. in order to be nitrided by exposure to a stream of $NH_3$ for approximately 10 minutes. After this nitriding step, a very thin film of silicon nitride is formed on the surface of the substrate, the film being obtained by reaction between $NH_3$ and silane $SiH_4$ at a temperature of 1080° C. for a time short enough to limit the thickness of the film to that of one atomic plane.

The operating conditions are the following:

The gaseous vehicle is a mixture of nitrogen and hydrogen in equal proportions (4 sl/Min.). The ammonia is introduced with a flow rate of 2 sl/min. while the silane, in a form diluted to 50 ppm in hydrogen, is introduced with a flow rate of 50 scc/min. Under these conditions, the typical $NH_3$ and $SiH_4$ reaction time is of the order of 30 seconds.

The successive steps are monitored by laser reflectometry (LR) and transmission electron microscopy (TEM).

After the dielectric layer has been completely formed, a continuous gallium nitrite layer having a thickness of 20 to 30 nm is deposited on the dielectric film. The deposition of the GaN layer is made at a low temperature, of the order of 600° C.

After the deposition of the GaN layer has been completed, it is annealed at a high temperature of the order of 1080° C. Under the combined effect of the temperature rise, of the presence in the gaseous vehicle of a sufficient amount of hydrogen and of the presence of the very thin dielectric film beneath the GaN layer, the morphology of said GaN layer undergoes deep modification resulting from solid-phase recrystallization by mass transport. When the temperature approaches 1060° C., it should be noted that the reflectivity of the buffer layer suddenly decreases. The initially continuous buffer layer is then converted into a discontinuous layer formed from gallium nitride islands.

Figure 7:
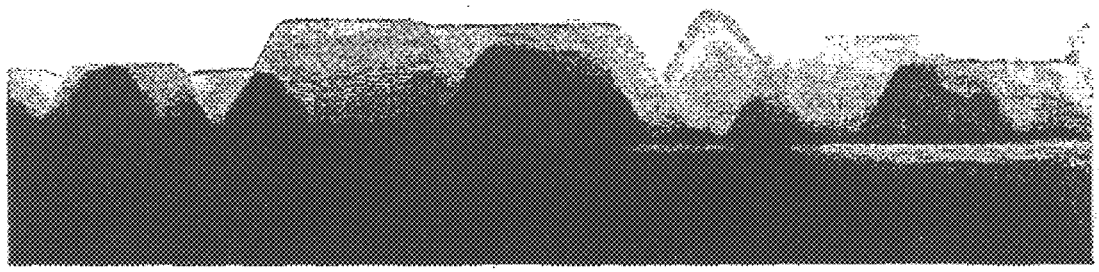
FIG. 7 is a photograph of the pyramids obtained during growth according to the Example 5, in transmission electron microscopy.

At the end of this spontaneous in situ recrystallization process, GaN features or islands of very good crystal quality are obtained, these retaining an epitaxial relationship with the substrate by virtue of the very small thickness of the dielectric layer. The GaN features or islands are isolated from one another-by regions or the dielectric layer is bared. The characteristic heights of the islands are of the order of 2400 angstroms. The observation obtained with a transmission electron microscope shows that the islands tend to take the shape of truncated pyramids (FIG. 7).

Figure 8:
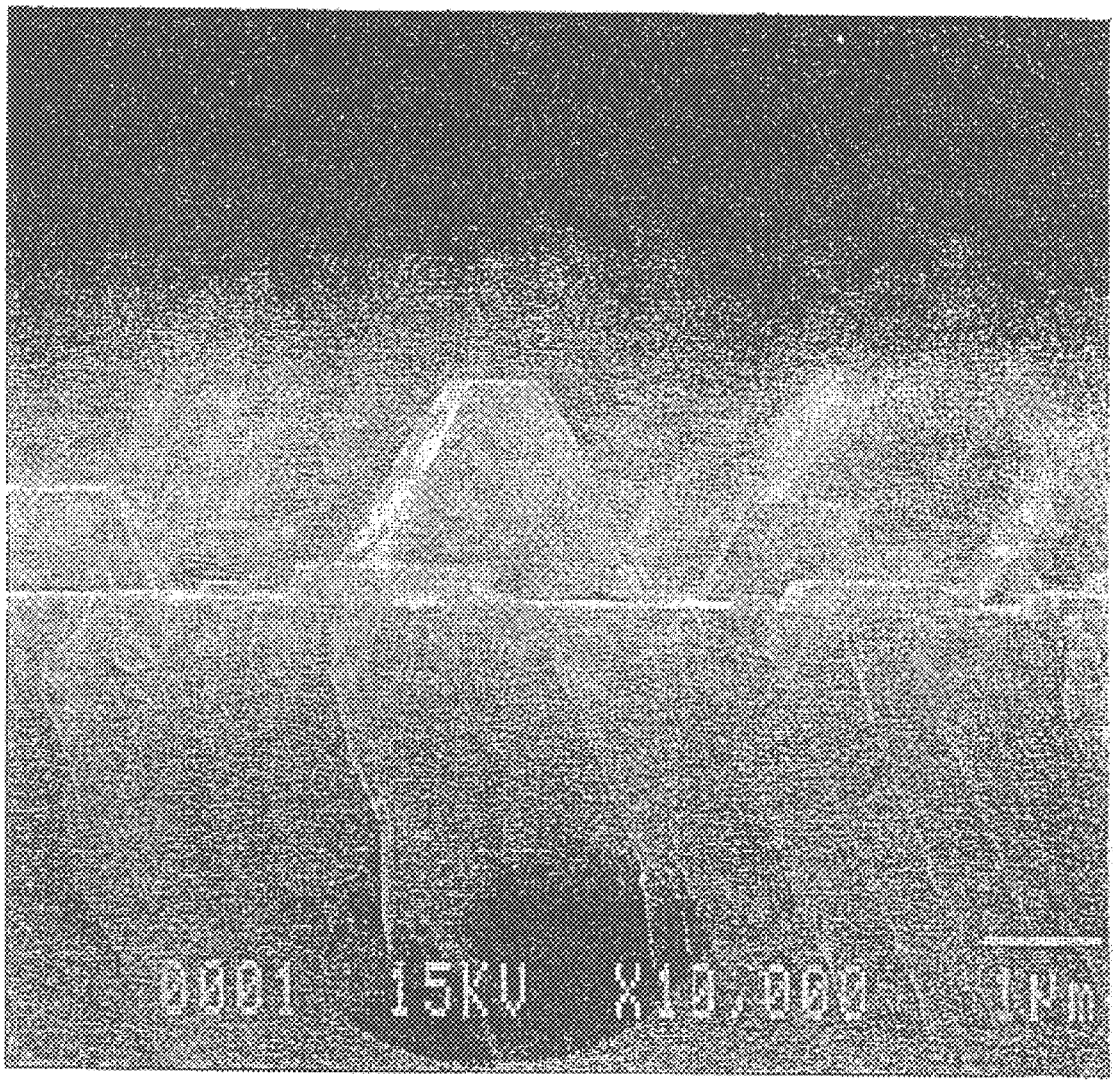
FIG. 8 is a photograph of the pyramids obtained during growth according to Example 5, in scanning electron microscopy.

FIG. 8 is a scanning electron microscope image of a specimen obtained under operating conditions that are modified so as to increase the dimensions of the islands to micrometric values comparable to those of the islands or features obtained in the apertures of a mask (cf. Example 1) produced ex situ by photolithography.

During the subsequent epitaxial regrowth with gallium nitride on the surface of a specimen, those regions of the dielectric where the layer of the dielectric is bared will function as the mask of FIG. 1 and the GaN features or islands thus spontaneously formed are the analogues of the GaN features (cf. FIG. 1 or FIG. 2) located in the apertures (cf. FIG. 1) which are produced ex situ in the mask (cf. FIG. 1). Explicitly, the GaN features or islands will develop by lateral and vertical growth.

GaN layers have thus been obtained by coalescence of the GaN features having a defect density of the order of $10^8$ $cm^{-2}$, i.e. two orders of magnitude less than that of the defects present in the gallium nitride layers produced using the conventional methods.

Thus, in the variants of the process that have been described in the above examples, especially Example 4 describing a two-step variant, the use of the ex situ process of etching the apertures in a mask may advantageously be avoided and replaced with the in situ spontaneous formation, described above, of the GaN islands or features, the control of their geometry and dispersion not being a prerequisite for improving the quality of the GaN layers formed by this process.

What is claimed is:

1. Process for producing an epitaxial layer of gallium nitride (GaN) comprising:
    depositing on a substrate, a dielectric layer functioning as a mask; and
    regrowing gallium nitride doped with a doping agent as an enhancer of lateral growth with respect to vertical growth on the masked substrate under vapor phase epitaxial deposition conditions so as to induce the deposition of gallium nitride features and an anisotropic and lateral growth of said features, the lateral growth being continued until coalescence of the various features.

2. Process for producing an epitaxial layer of gallium nitride (GaN) according to claim 1 wherein the substrate is chosen from the group consisting of sapphire, ZnO, 6H—SiC and $LiAlO_2$.

3. Process for producing an epitaxial layer of galium nitride (GaN) according to claim 1, wherein the dielectric layer is a layer of the $Si_xN_y$ type.

4. Process for producing an epitaxial layer of gallium nitride (GaN) according to claim 1, wherein the dielectric layer is an atomic monolayer or a cover of the order of one atomic plane.

5. Process for producing an epitaxial layer of gallium nitride (GaN) according to claim 1, further comprising:
    after depositing the dielectric the dielectric layer, etching the dielectric layer to define apertures and to expose the facing regions of the substrate, and
    wherein gallium nitride is regrown under epitaxial deposition conditions on the masked and etched substrate so as to induce the deposition of gallium nitride features on the facing regions and the anisotropic and lateral growth of said features (6), the lateral growth being continued until coalescence of the various features.

6. Process of producing an epitaxial layer of gallium nitride (GaN) according to claim 1, comprising:
    depositing the dielectric layer (3) on a thin gallium nitride layer;
    etching the dielectric layer to define apertures (4) and to expose those regions (5) of said thin gallium nitride layer which face them; and
    regrowing gallium nitride under epitaxial deposition conditions on the epitaxially grown, masked and etched substrate so as to induce the deposition of gallium nitride features on the facing regions and the anisotropic and lateral growth of said regions (6), the lateral growth being continued until coalescence of the various features.

7. Process for producing an epitaxial layer of gallium nitride (GaN) according to claim 5, wherein the apertures are one of discrete apertures and apertures in the form of stripes.

8. Process for producing an epitaxial layer of gallium nitride (GaN) according to claim 7, wherein the discrete apertures are regular polygons.

9. Process for producing an epitaxial layer of gallium nitride (GaN) according to claim 7, wherein the discrete apertures are inscribed in a circle of radius of less than 10 $\mu$m.

10. Process for producing an epitaxial layer of gallium nitride (GaN) according to claim 7, wherein the apertures in the form of stripes have a width of less than 10 $\mu$m.

11. Process for producing an epitaxial layer of gallium nitride (GaN) according to claim 6, wherein the apertures are one of discrete apertures and apertures in the form of stripes.

12. Process for producing an epitaxial layer of gallium nitride (GaN) according to claim 11, wherein the discrete apertures are regular polygons.

13. Process for producing an epitaxial layer of gallium nitride (GaN) according to claim 12, wherein the discrete apertures are inscribed in a circle of radius of less than 10 $\mu$m.

14. Process for producing an epitaxial layer of gallium nitride (GaN) according to claim 11, wherein the apertures in the form of stripes have a width of less than 10 $\mu$m.

15. Process for producing an epitaxial layer of gallium nitride (GaN) according to claim 1, further comprising, after depositing the dielectric layer, exposing a portion of the substrate, wherein the exposed portion of substrate or of gallium nitride with respect to the total area of the substrate is between 5 and 80 percent.

16. Process for producing an epitaxial layer of gallium nitride (GaN) according to claim 1, wherein the exposed portion of substrate or of gallium nitride with respect to the total area of the substrate is between 5 and 50 percent.

17. Process for producing an epitaxial layer of gallium nitride (GaN) according to claim 1, wherein the doping agent comprises magnesium and the magnesium-doped gallium nitride is regrown on the masked, epitaxially grown, and etched substrate.

18. Process for producing an epitaxial layer of gallium nitride (GaN) according to claim 11, wherein a dopant/gallium molar ratio in the vapor phase is greater than 0 and less than or equal to 1.

19. Process for producing an epitaxial layer of gallium nitride (GaN) according to claim 1, wherein the doping agent comprises magnesium and the magnesium-doped gallium nitride is regrown on the masked, and etched substrate.

20. Process for producing an epitaxial layer of gallium nitride (GaN) according to claim 19, wherein a dopant/gallium molar ratio in the vapor phase is greater than 0 and less than or equal to 1.

21. Process for producing an epitaxial layer of gallium nitride (GaN) according to claim 1, wherein the regrowing gallium nitride comprises depositing under vapor phase epitaxial conditions and the vapor phase epitaxial deposition conditions involve the use of a carrier gas comprising a hydrogen gas.

22. Process for producing an epitaxial layer of gallium nitride (GaN) according to claim 21, wherein the vapor phase epitaxial deposition conditions involve the use of a carrier gas further comprising a nitrogen gas.

23. Process for producing an epitaxial layer of gallium nitride (GaN) according to claim 1, wherein prior to regrowing gallium nitride doped with a doping agent, the masked, and etched substrate undergoes regrowth, regrowing undoped gallium nitride.

24. Process for producing an epitaxial layer of gallium nitride (GaN) according to claim 23, wherein prior to regrowing gallium nitride doped with a doping agent, the masked, epitaxially grown and etched substrate undergoes regrowth, regrowing undoped gallium nitride.

25. Epitaxial doped gallium nitride layer, wherein obtained by the process according to claim 1.

26. Optoelectronic component, wherein they are provided with an epitaxial layer of gallium nitride according to claim 25.

27. Optoelectronic component of claim 26, comprising a diode laser.

28. Epitaxial gallium nitride layer according to claim 25, wherein it has a thickness of between 1 $\mu$m and 1000 $\mu$m and in that it is separable from its substrate.

29. Optoelectronic component, wherein they are provided with an epitaxial layer of gallium nitride according to claim 28.

30. Optoelectronic component of claim 29, comprising a diode laser.

* * * * *

UNITED STATES PATENT AND TRADEMARK OFFICE
CERTIFICATE OF CORRECTION

PATENT NO.    : 6,325,850 B1
DATED         : December 4, 2001
INVENTOR(S)   : Beaumont et al.

It is certified that error appears in the above-identified patent and that said Letters Patent is hereby corrected as shown below:

<u>Title page,</u>
Item [73], Assignee, delete "Recherché" and insert -- Recherche --.

<u>Column 9,</u>
Line 65, after "the dielectric" delete the second occurrence of "the dielectric".

<u>Column 10,</u>
Line 63, delete "claim 11" and insert -- claim 17 --.

Signed and Sealed this

Tenth Day of September, 2002

*Attest:*

*Attesting Officer*

JAMES E. ROGAN
*Director of the United States Patent and Trademark Office*